United States Patent
Doherty

(10) Patent No.: US 11,956,924 B1
(45) Date of Patent: Apr. 9, 2024

(54) QUANTUM PROCESSING CIRCUITRY COOLING SYSTEMS AND METHODS

(71) Applicant: Montana Instruments Corporation, Bozeman, MT (US)

(72) Inventor: Josh Doherty, Bozeman, MT (US)

(73) Assignee: Montana Instruments Corporation, Bozeman, MT (US)

( * ) Notice: Subject to any disclaimer, the term of this patent is extended or adjusted under 35 U.S.C. 154(b) by 61 days.

(21) Appl. No.: 17/398,949

(22) Filed: Aug. 10, 2021

Related U.S. Application Data

(60) Provisional application No. 63/063,870, filed on Aug. 10, 2020.

(51) Int. Cl.
*G06F 1/20* (2006.01)
*H05K 7/20* (2006.01)

(52) U.S. Cl.
CPC .......... *H05K 7/20372* (2013.01); *G06F 1/20* (2013.01); *H05K 7/20327* (2013.01); *H05K 7/2039* (2013.01); *G06F 2200/201* (2013.01)

(58) Field of Classification Search
CPC .............. F17C 3/085; F17C 2203/0687; F17C 13/006; F17C 2270/0509;
(Continued)

(56) References Cited

U.S. PATENT DOCUMENTS 2,793,757 A    5/1957  McWethy
3,236,334 A    2/1966  Wallerstein, Jr.
(Continued)

FOREIGN PATENT DOCUMENTS

CN    103901232        7/2014
CN    107906844 A      4/2018
(Continued)

OTHER PUBLICATIONS

U.S. Appl. No. 11/047,779, filed Jun. 29, 2021, Doherty et al.
(Continued)

*Primary Examiner* — Mandeep S Buttar
(74) *Attorney, Agent, or Firm* — Wells St. John P.S.

(57) ABSTRACT

Quantum processing circuitry cooling systems are provided. The systems can include: a first chamber maintained at a first pressure; a second chamber maintained at a second pressure, wherein the first and second pressures are independent from one another; a cooler within the first chamber and operable to act as a cooling source for the cooling system; and quantum processing circuitry within the second chamber, the quantum processing circuitry being thermally coupled to the cooler. Cooling systems are also provided that can include: a cooler configured to generate and/or store cryofluid; a device thermally coupled to the cooler; and a plurality of thermal couplings between the cooler and the device, at least one of the thermal couplings being a first conduit system configured to convey cryofluid between the cooler and the device, wherein the first conduit system includes a first heat exchanger within the cooler and is configured to receive the cryofluid from the device, cool the cryofluid using the heat exchanger and provide cooler cryofluid to the device. Methods for cooling quantum processing circuitry are also provided. The methods can include providing cooling to quantum processing circuitry from a cooling source in a chamber having an independent pressure from the pressure about the quantum processing circuitry.

15 Claims, 9 Drawing Sheets

(58) Field of Classification Search
CPC .. F17C 2203/0366; F25D 19/006; G06F 1/20; G06F 2200/201; H05K 7/20372; H05K 1/0203; H05K 7/20336; F28D 2021/0033
USPC .................................................. 361/679.53
See application file for complete search history.

(56) References Cited

U.S. PATENT DOCUMENTS

| | | | |
|---|---|---|---|
| 3,415,077 A | 12/1968 | Collins | |
| 3,444,365 A | 5/1969 | Loebe | |
| 3,595,275 A | 7/1971 | Steans et al. | |
| 3,613,387 A | 10/1971 | Collins | |
| 3,894,403 A | 7/1975 | Longsworth | |
| 3,910,277 A | 10/1975 | Zimmer | |
| 3,929,516 A | 12/1975 | Cheskis et al. | |
| 4,011,732 A | 3/1977 | Doherty et al. | |
| 4,036,617 A | 7/1977 | Leonard et al. | |
| 4,161,747 A | 7/1979 | Jennings | |
| 4,242,885 A | 1/1981 | Quack et al. | |
| 4,279,127 A | 7/1981 | Longsworth | |
| 4,303,105 A | 12/1981 | Rohner | |
| 4,360,087 A | 11/1982 | Curwen | |
| 4,415,184 A | 11/1983 | Stephenson et al. | |
| 4,543,794 A | 10/1985 | Matsutani et al. | |
| 4,713,942 A | 12/1987 | Hofmann | |
| 4,745,760 A | 5/1988 | Porter | |
| 4,745,761 A | 5/1988 | Bazaj et al. | |
| 4,757,261 A | 7/1988 | Kneip, Jr. | |
| 4,790,147 A | 12/1988 | Kuriyama et al. | |
| 4,848,093 A | 7/1989 | Simmonds et al. | |
| 4,854,131 A | 8/1989 | Sakitani et al. | |
| 4,869,068 A | 9/1989 | Van Vloten | |
| 4,968,663 A | 11/1990 | Whang | |
| 5,099,650 A | 3/1992 | Crunkleton | |
| 5,129,232 A | 7/1992 | Minas et al. | |
| 5,148,896 A | 9/1992 | Ralph | |
| 5,327,733 A | 7/1994 | Boolchand et al. | |
| 5,345,769 A | 9/1994 | Liepert et al. | |
| 5,349,823 A | 9/1994 | Solomon | |
| 5,410,910 A | 5/1995 | Somlyo et al. | |
| 5,485,731 A | 1/1996 | Venetucci et al. | |
| 5,552,608 A | 9/1996 | Gallagher et al. | |
| 5,584,184 A | 12/1996 | Inaguchi et al. | |
| 5,613,367 A | 3/1997 | Chen | |
| 5,628,195 A | 5/1997 | Hill et al. | |
| 5,647,228 A | 7/1997 | Sager et al. | |
| 5,665,314 A | 9/1997 | Berger et al. | |
| 5,737,927 A | 4/1998 | Takahashi et al. | |
| 5,749,243 A | 5/1998 | Lester | |
| 5,755,715 A | 5/1998 | Stern et al. | |
| 5,889,456 A | 3/1999 | Triebe et al. | |
| 5,936,499 A | 8/1999 | Eckels | |
| 5,979,176 A | 11/1999 | Stables et al. | |
| 5,996,638 A | 12/1999 | Schippl | |
| 6,005,964 A | 12/1999 | Reid et al. | |
| 6,196,005 B1 | 3/2001 | Stautner | |
| 6,263,677 B1 | 7/2001 | Hafner et al. | |
| 6,280,688 B1 | 8/2001 | Motz | |
| 6,336,332 B1 | 1/2002 | Cohu | |
| 6,427,778 B1 | 8/2002 | Beall et al. | |
| 7,430,871 B2 | 10/2008 | Strobel | |
| 7,628,536 B2 | 12/2009 | Umemura | |
| 7,932,733 B2 | 4/2011 | Sasajima et al. | |
| 8,066,429 B2 | 11/2011 | Danley | |
| 8,114,321 B2 | 2/2012 | Johnson | |
| 8,671,698 B2 | 3/2014 | Wang | |
| 8,746,008 B1 | 6/2014 | Mauritsen et al. | |
| 8,756,941 B2 | 6/2014 | Snow et al. | |
| 9,134,047 B2 | 9/2015 | Black et al. | |
| 9,243,726 B2 | 1/2016 | Reid et al. | |
| 9,303,914 B2 | 4/2016 | Mauritsen et al. | |
| 9,458,969 B2 | 10/2016 | Prester et al. | |
| 9,618,257 B2 | 4/2017 | Black et al. | |
| 9,620,272 B2 | 4/2017 | Nakayama | |
| 9,821,421 B2 | 11/2017 | Mauriitsen et al. | |
| 10,165,667 B1* | 12/2018 | Christiansen | H05K 1/181 |
| 10,451,529 B2 | 10/2019 | Schreibeis et al. | |
| 10,775,285 B1 | 9/2020 | Baker et al. | |
| 10,785,891 B1* | 9/2020 | Monroe | H05K 7/20372 |
| 11,125,663 B1 | 9/2021 | Henslee et al. | |
| 11,125,664 B2 | 9/2021 | Doherty et al. | |
| 11,150,169 B2 | 10/2021 | Reijnders et al. | |
| 11,248,996 B2 | 2/2022 | Doherty et al. | |
| 11,275,000 B2 | 3/2022 | Doherty et al. | |
| 11,480,299 B1* | 10/2022 | Najafi-Yazdi | F17C 3/085 |
| 2001/0023592 A1 | 9/2001 | Odawara et al. | |
| 2003/0177814 A1 | 9/2003 | Weckstrom et al. | |
| 2004/0187519 A1 | 9/2004 | Zhu et al. | |
| 2005/0067159 A1 | 3/2005 | Hall et al. | |
| 2005/0126187 A1 | 6/2005 | Li et al. | |
| 2005/0140959 A1 | 6/2005 | Tsuji et al. | |
| 2005/0204748 A1 | 9/2005 | Yamanaka et al. | |
| 2005/0229609 A1 | 10/2005 | Kirichek et al. | |
| 2006/0148276 A1 | 7/2006 | Renaudin | |
| 2007/0234751 A1 | 10/2007 | Nagamune | |
| 2007/0271933 A1 | 11/2007 | Miki | |
| 2007/0278719 A1 | 12/2007 | Adachi et al. | |
| 2008/0315090 A1 | 12/2008 | Nakasuji et al. | |
| 2009/0094992 A1 | 4/2009 | Wang | |
| 2009/0195980 A1 | 8/2009 | Shih | |
| 2009/0199579 A1 | 8/2009 | Kundig | |
| 2009/0212890 A1 | 8/2009 | Saho et al. | |
| 2009/0224788 A1 | 9/2009 | Sasajima et al. | |
| 2009/0272127 A1 | 11/2009 | Radovinsky et al. | |
| 2010/0050661 A1 | 3/2010 | Snow et al. | |
| 2011/0219785 A1 | 9/2011 | Black et al. | |
| 2012/0011859 A1 | 1/2012 | Black et al. | |
| 2012/0031110 A1 | 2/2012 | Tanaka | |
| 2012/0096873 A1 | 4/2012 | Webber et al. | |
| 2013/0021032 A1 | 1/2013 | Heiss et al. | |
| 2013/0047633 A1 | 2/2013 | Leach et al. | |
| 2013/0179090 A1 | 7/2013 | Conroy et al. | |
| 2014/0007596 A1 | 1/2014 | Prester et al. | |
| 2014/0130520 A1 | 5/2014 | Snow et al. | |
| 2014/0202174 A1 | 7/2014 | Wang | |
| 2014/0245757 A1 | 9/2014 | Garside et al. | |
| 2014/0248649 A1 | 9/2014 | Mayer et al. | |
| 2015/0248002 A1 | 9/2015 | Ingersoll et al. | |
| 2015/0252799 A1 | 9/2015 | Roscher | |
| 2015/0300719 A1* | 10/2015 | Strickland | F25B 25/005 62/62 |
| 2015/0323626 A1 | 11/2015 | Jonas et al. | |
| 2015/0332829 A1 | 11/2015 | Stautner et al. | |
| 2015/0338151 A1 | 11/2015 | Miki | |
| 2015/0355091 A1 | 12/2015 | Conroy et al. | |
| 2016/0123537 A1 | 5/2016 | Heiss et al. | |
| 2017/0168121 A1 | 6/2017 | Yu et al. | |
| 2017/0261413 A1 | 9/2017 | Schreibeis et al. | |
| 2017/0323764 A1 | 11/2017 | Muto et al. | |
| 2019/0025166 A1 | 1/2019 | Schreibeis et al. | |
| 2019/0162777 A1 | 5/2019 | Chiang et al. | |
| 2019/0170620 A1 | 6/2019 | Reijnders et al. | |
| 2019/0170621 A1 | 6/2019 | Doherty et al. | |
| 2019/0170623 A1 | 6/2019 | Doherty et al. | |
| 2020/0109764 A1 | 4/2020 | Motley et al. | |
| 2020/0149686 A1 | 5/2020 | Neils et al. | |
| 2020/0265963 A1* | 8/2020 | Wong | G21B 1/01 |
| 2021/0005366 A1 | 1/2021 | Doherty et al. | |
| 2021/0278745 A1* | 9/2021 | Groeblacher | G02F 2/02 |
| 2021/0326739 A1 | 10/2021 | Jeffrey | |
| 2022/0092459 A1* | 3/2022 | Bogorin | H10N 60/12 |
| 2022/0237495 A1* | 7/2022 | Yohannes | H10N 60/12 |
| 2023/0155593 A1* | 5/2023 | Abdo | H10N 69/00 326/3 |

FOREIGN PATENT DOCUMENTS

| | | |
|---|---|---|
| DE | 102018130882 A1 | 6/2019 |
| EP | 0619440 | 10/1994 |
| FR | 3023900 A1 | 1/2016 |
| GB | 2457054 A | 8/2009 |
| GB | 2566024 A | 3/2019 |

(56) References Cited

FOREIGN PATENT DOCUMENTS

| JP | 05059503 A | 3/1993 |
| JP | H06-341487 A | 12/1994 |
| WO | WO 2018/168304 | 2/2018 |

OTHER PUBLICATIONS

WO PCT/2019/55449 IPRP, dated Apr. 8, 2021, Montana Instruments Corp.
WO PCT/2019/55449 Search Rpt, dated Jan. 8, 2020, Montana Instruments Corp.
WO PCT/2019/55449 Writ Opin, dated Jan. 8, 2020, Montana Instruments Corp.
Majorana et al., "Vibration Free Cryostat for cooling suspended mirrors", Journal of Physics: Conference Series 32, (2006), pp. 374-379.
Mueller Copper 1100 (Electrolytic Tough Pitch Copper), Alloy Digest, 1983, 2 pages.
Snow, U.S. Appl. No. 61/136,138, filed Aug. 14, 2008, titled "Apparatus(es) & Methods for Improving Vibration Isolation, Thermal Dampening, Optical Access in Cryogenic Refrigerators", 18 pages.
Wang et al., "A Compact Cold Helium Circulation System with GM Cryocooler", 2014, United States, 6 pages.
White, G.K., "The Thermal and Electrical Conductivity of Copper At Low Temperatures", 1953, pp. 398-404.
http://coldedgetech.com/stinger ColdEdge Technologies, Jun. 11, 2017; United States, 6 pages.
RC102-CFM Microscopy Cryostat System Brochure, Cryo Industries of America, Inc., Sep. 3, 2013; United States, 14 pages.

\* cited by examiner

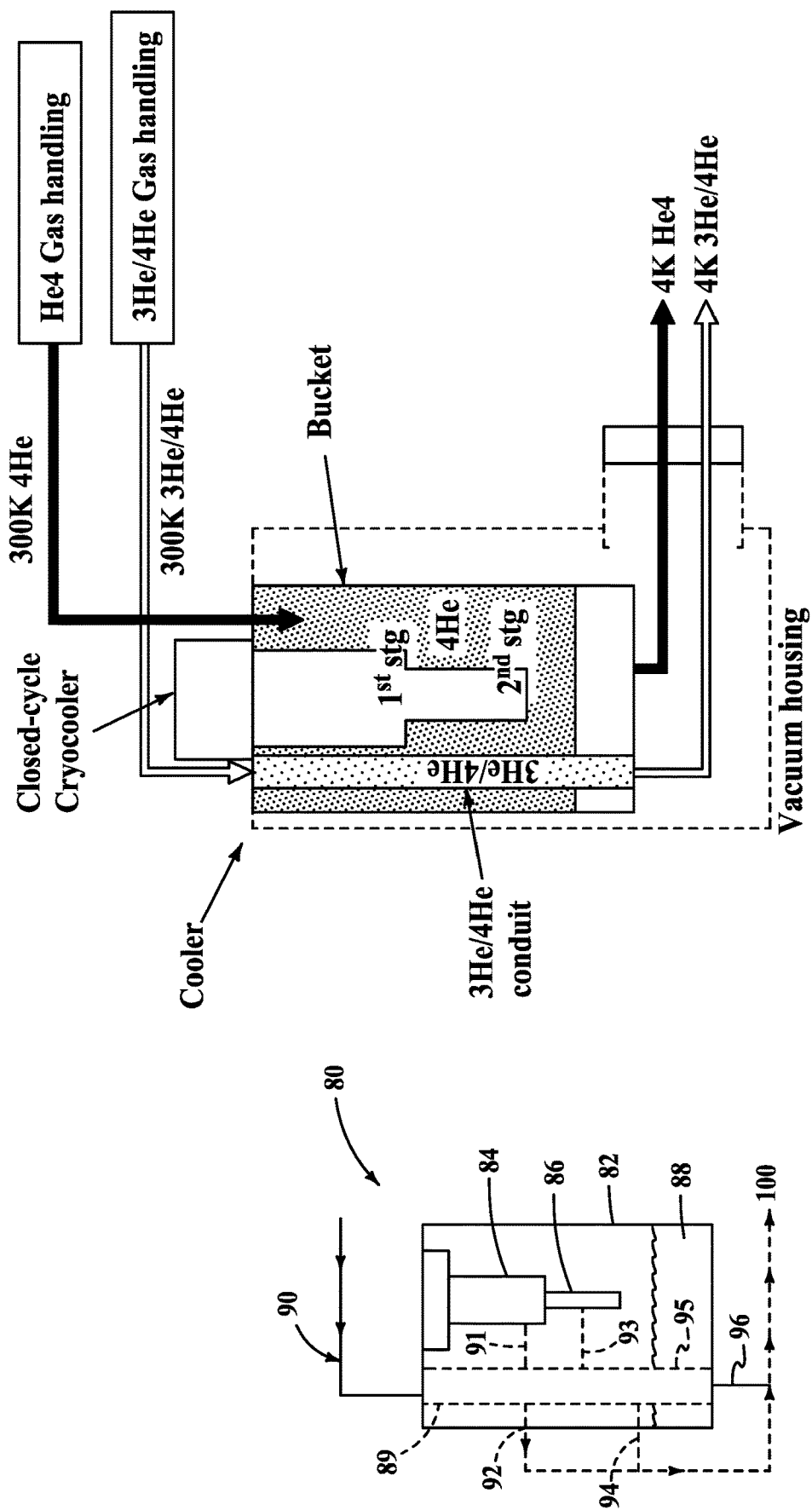

QUANTUM PROCESSING CIRCUITRY COOLING SYSTEMS AND METHODS

CROSS REFERENCE TO RELATED APPLICATION

This application claims priority to and the benefit of U.S. Provisional Patent Application Ser. No. 63/063,870 filed Aug. 10, 2020, entitled "Processing Circuitry Cooling Assemblies and Methods", the entirety of which is incorporated by reference herein.

TECHNICAL FIELD

The present disclosure relates to processing circuitry cooling systems and/or methods, particularly cooling systems and/or methods for cooling quantum processing circuitry.

BACKGROUND

Cryogenic cooling is essential to many quantum technologies including quantum sensing, quantum networking, and quantum computing, where temperatures down to 100 mK are required to leverage quantum coherent behavior. These systems are generally referred to herein as quantum processing circuitry. For low-cost operation, these technologies rely on closed-cycle mechanical refrigerators called cryocoolers to reach and maintain operation at cryogenic temperatures. Current quantum system architectures typically build around the cryocooler, positioning components as close to the cryocooler as possible as to maximize conductive cooling power and reduce losses. With such dependence, the pace of quantum technology advancement is currently limited by the traditional cryocooler design. For example, scaling remains a major challenge for superconducting qubit-based quantum computers that contain hundreds of coaxial lines for control and readout of quantum states due to limitations in current architecture cooling power and surface area. To harness the potential of quantum technologies, a modular cryogenic system design built around the quantum system is required.

A quantum computer, like the IBM Q System One shown in FIG. 1A, is a type of computer that encodes information and performs calculation using qubits; the quantum mechanical analogue of a classical computer bit via superposition can be in multiple states at one time, enabling quantum computers to perform calculations exponentially faster. Several types of quantum computing systems exist, including: superconducting qubit computers, ion-trapping computers, and photonic circuit based approaches.

Quantum states are extremely delicate and to harness the power of quantum computers, great care must be taken to isolate qubits from the environment where fluctuations in temperature, mechanical vibrations, and/or poor vacuum can disrupt the quantum state. To prevent disruption, quantum computers require cryogenic conditions to reduce thermal energy. Traditional cryogenic solutions utilized today were not built for quantum computers and pose many challenges for scaling from the 10's of qubit quantum computers of today to the millions of qubits necessary for a quantum computer to be truly functional.

Quantum processing circuitry configurations are complex systems that operate under high-vacuum and cryogenic conditions. Within a vacuum housing they can contain electronic components (RF amplifiers, isolators, filters), integrated circuits (memory, processors), and in some case optics, photonic circuits, photon detectors, etc. They also contain various input-output (I/O) lines, for example coaxial cables, fiber optic cables, etc., used to control and read the state that connect components inside the vacuum housing to the outside world.

SUMMARY

Quantum processing circuitry cooling systems are provided. The systems can include: a first chamber maintained at a first pressure; a second chamber maintained at a second pressure, wherein the first and second pressures are independent from one another; a cooler within the first chamber and operable to act as a cooling source for the cooling system; and quantum processing circuitry within the second chamber, the quantum processing circuitry being thermally coupled to the cooler.

Cooling systems are also provided that can include: a cooler configured to generate and/or store cryofluid; a device thermally coupled to the cooler; and a plurality of thermal couplings between the cooler and the device, at least one of the thermal couplings being a first conduit system configured to convey cryofluid between the cooler and the device, wherein the first conduit system includes a first heat exchanger within the cooler and is configured to receive the cryofluid from the device, cool the cryofluid using the heat exchanger and provide cooler cryofluid to the device.

Methods for cooling quantum processing circuitry are also provided. The methods can include providing cooling to processing circuitry from a cooling source in a chamber having an independent pressure from the pressure about the processing circuitry.

DRAWINGS

Embodiments of the disclosure are described below with reference to the following accompanying drawings.

FIG. 8 is a box diagram of another processing circuitry cooling system according to another embodiment of the disclosure.

FIG. 9 is a box diagram of another processing circuitry cooling system according to another embodiment of the disclosure.

DESCRIPTION

This disclosure is submitted in furtherance of the constitutional purposes of the U.S. Patent Laws "to promote the progress of science and useful arts" (Article 1, Section 8).

The present disclosure will be described with reference to FIGS. 1A-9.

Physically locating the cooler components described above within the quantum computer is a challenge. More so, with current cryogenic architectures, all these components must be physically located as close to the cryocooler as necessary to maximize cooling power. FIG. 1A shows how densely these components are arranged around the cryocooler located in center of the quantum computer.

Figure 1B:
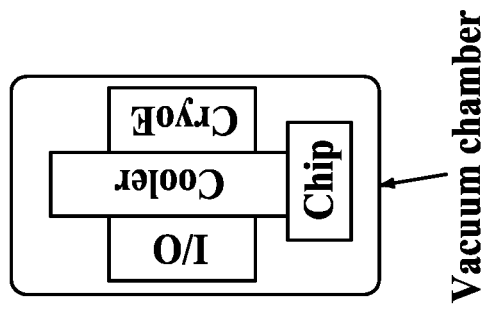
FIG. 1B is a box diagram of a current quantum processing circuitry system.
Figure 1A:
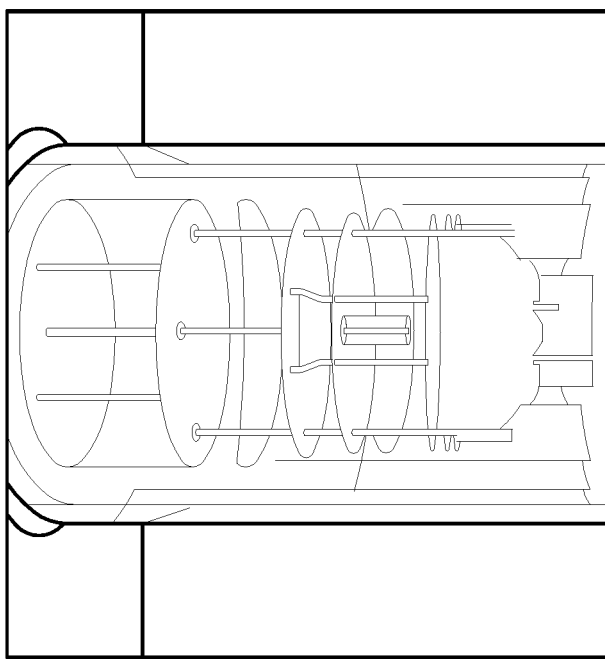
FIG. 1A is a depiction of quantum processing circuity.

FIG. 1B is a simplified block diagram of a current quantum computing architecture showing example of quantum processing circuitry (cryogenic electronics or cryoE, I/O, and chip) are located as close to the cooler as possible.

The cooler can represent a mechanical cryocooler; a closed-cycle mechanical refrigerator that provides lower operating costs compared to open-cycle cryogenic systems that must be continuously replenished with expensive cryogenic fluids. Mechanical cryocoolers, including Gifford-McMahon and/or Pulse Tube, provide a discrete number of cooling stages. Typically, there are two stages: the $1^{st}$ stage provides increased cooling power at an intermediate temperature (30K) and the $2^{nd}$ stage provides the lowest temperature (4K), albeit with decreased cooling power. Each stage can include a mounting flange, to which components that need to be cryogenically cooled can be mounted. Heat can be removed from components of interest via solid conduction. Because the cooling power available to cool a component of interest is inversely related to the distance from the cryocooler, current cryogenic system architectures typically build around the cryocooler. Specifically, as shown, the cryocooler is placed in the center of the system and components to be cooled are positioned as close to the cryocooler as possible.

For example, as show in FIG. 1B, components of quantum processing circuitry, such as the quantum chip, cryogenic electronics (CryoE), and I/O that connect the chip and electronics to room temperature control and measurement systems are 1) physically located as close as possible to the cooler and 2) at temperatures only provided at discrete cooling stages provided by the cooler. Such architectures, where all components must fit within a single vacuum chamber, are limited by available surface area and cooling power which presents a significant challenge to scaling up to millions of qubits necessary for quantum computers to be truly useful.

Figure 2:
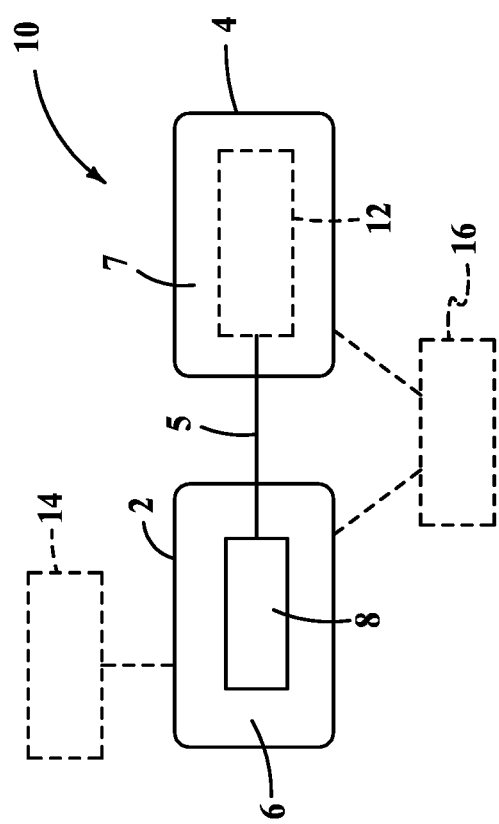
FIG. 2 is a box diagram of a processing circuitry cooling system according to an embodiment of the disclosure.

Referring to FIG. 2, a block diagram of a quantum processing circuitry cooling system according to an embodiment of the disclosure is shown. System 10 can include a first chamber 2 maintained at a first pressure 6. Chamber 2 can house a cooler 8 that is operational to provide cooling and/or act as a cooling source. Cooler 8 can be configured as a condenser for condensing cryo fluid and/or a cooling source for providing conductive cooling. Electronics and/or gas handling components 14 can be operatively coupled to cooler 8.

A second chamber 4 can be maintained at a second pressure 7. As shown the first and second pressures can be independent of one another. Quantum processing circuitry 12 is provided within the second chamber 4 and operatively coupled for cooling via a link 5 to cooler 8. Link 5 can be a single or multiple links. Link 5 can provide cooling power via conduction and/or cryofluid. Link 5 can provide cooling power to within chamber 4 and/or other portions or components of quantum processing circuitry 12 including, but not limited to input/output, cryo-processing circuitry (cryo electronics). Additionally, the systems of the present disclosure can include their own processing circuitry 16 configured to control associated pumps, valves, temperature sensors of the system, and/or control devices.

Figure 3:
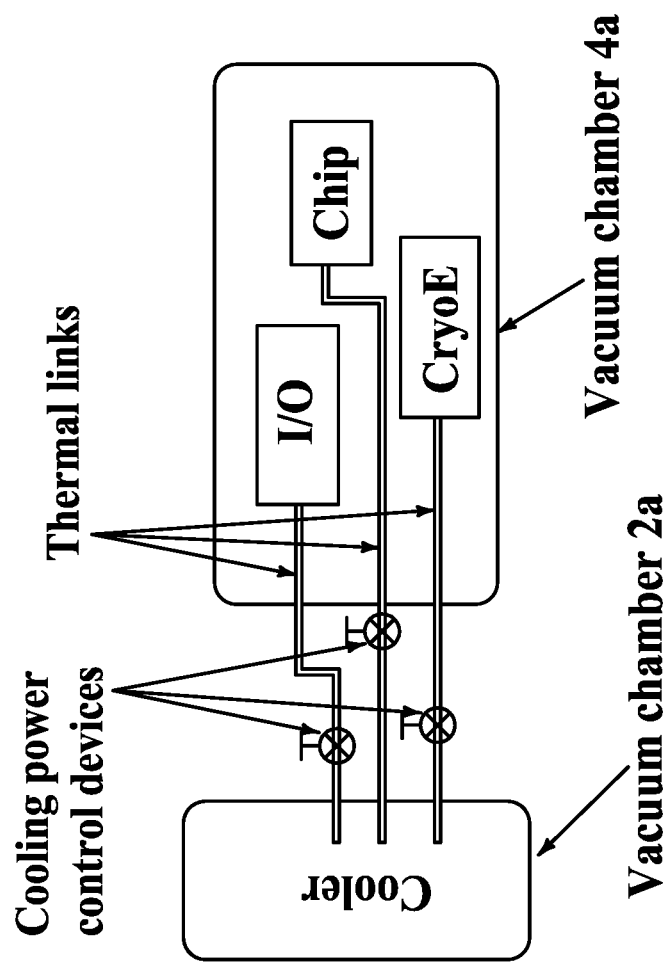
FIG. 3 is a box diagram of another processing circuitry cooling system according to another embodiment of the disclosure.

FIG. 3 is a block diagram of another embodiment of the quantum processing circuitry cooling system. In this embodiment, the constraints of physical distance from the cryocooler are removed, enabling the individual quantum processing circuitry components (I/O, chip, and cryo electronics) to be positioned at locations distant from the cooler and in different vacuum chambers. As shown, each component may be independently cooled with a dedicated thermal link to the cooler, with individual cooling power control devices that can operate at different temperatures, providing for an optimization of available cooling power.

The thermal links can represent a conduit through which a quantum processing circuitry (I/O, chip, and/or cryo electronics) can be in thermal communication with a cooling source. The thermal links can be configured using components of high thermal conductivity, including copper or aluminum, where cooling power is provided via solid conduction. As an example, the cooling power control devices are provided by controlling the geometry (cross sectional area and/or length) of the thermal links to control available cooling power that will then dictate resulting temperature of each component.

The thermal links may also represent cryogenic fluid conduits through which one or more cryogenic fluids can be delivered from a cryogenic fluid source, such as a cooler where a cryocooler is positioned within a bucket where cooled cryogenic fluid is collected and stored, to the component of interest. In this case, the cooling power control device can be used to vary the flow of cryogenic fluid to the component and thereby control the resultant temperature of the quantum computing component. In one embodiment, the cooling power control device can be a mechanical valve that can be controlled to open/close or proportionally opened to vary the flow of cryogenic fluid through the conduits. In another embodiment, the cooling power control device can be achieved by varying the pressure of the cooler (see for example, US Patent Application Publication No. US 2021/0005366 to Doherty et al., the entirety of which is incorporated by reference herein). In another embodiment, the cooling power control device can be achieved by varying the cross-sectional area and length of the cryogenic fluid to control the pressure drop and thereby flow of cryogenic fluid through the conduit. In another embodiment, the cooling power control device can be comprised of a fluid conduit with a heater element that can be controlled to induce a vapor lock within the cryogenic fluid conduit to control flow (see for example, U.S. Pat. No. 11,047,779 to Doherty et al., the entirety of which is incorporated by reference herein).

Figure 4A:
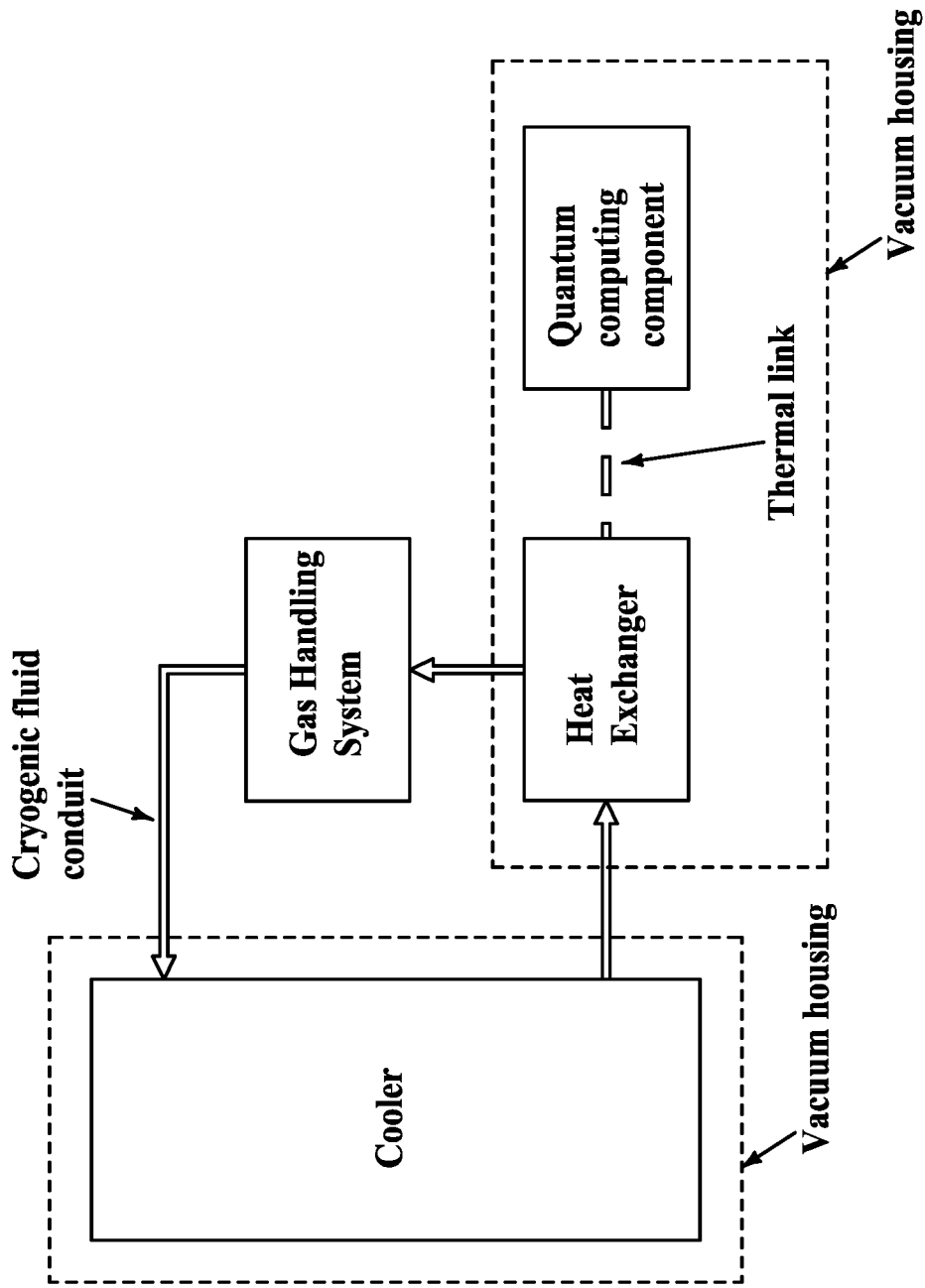
FIG. 4A is a box diagram of another processing circuitry cooling system according to another embodiment of the disclosure.

FIG. 4A depicts a block diagram of another system of the present disclosure that details components used when a fluid conduit is used as the thermal link. The cooler represents a source of cryogenic fluid in one vacuum housing. The system includes a heat exchanger and quantum processing circuitry in another vacuum housing. Cryogenic fluid flows from the cooler to the heat exchanger through a gas handling system, and back to the cooler. The heat exchanger and quantum processing circuitry are in thermal communication through a thermal link such that the temperature of the quantum processing circuitry can be the temperature of the cryogenic fluid upon entry into the heat exchanger. The thermal link can be solid conduction and/or a fluid conduit.

Figure 4B:
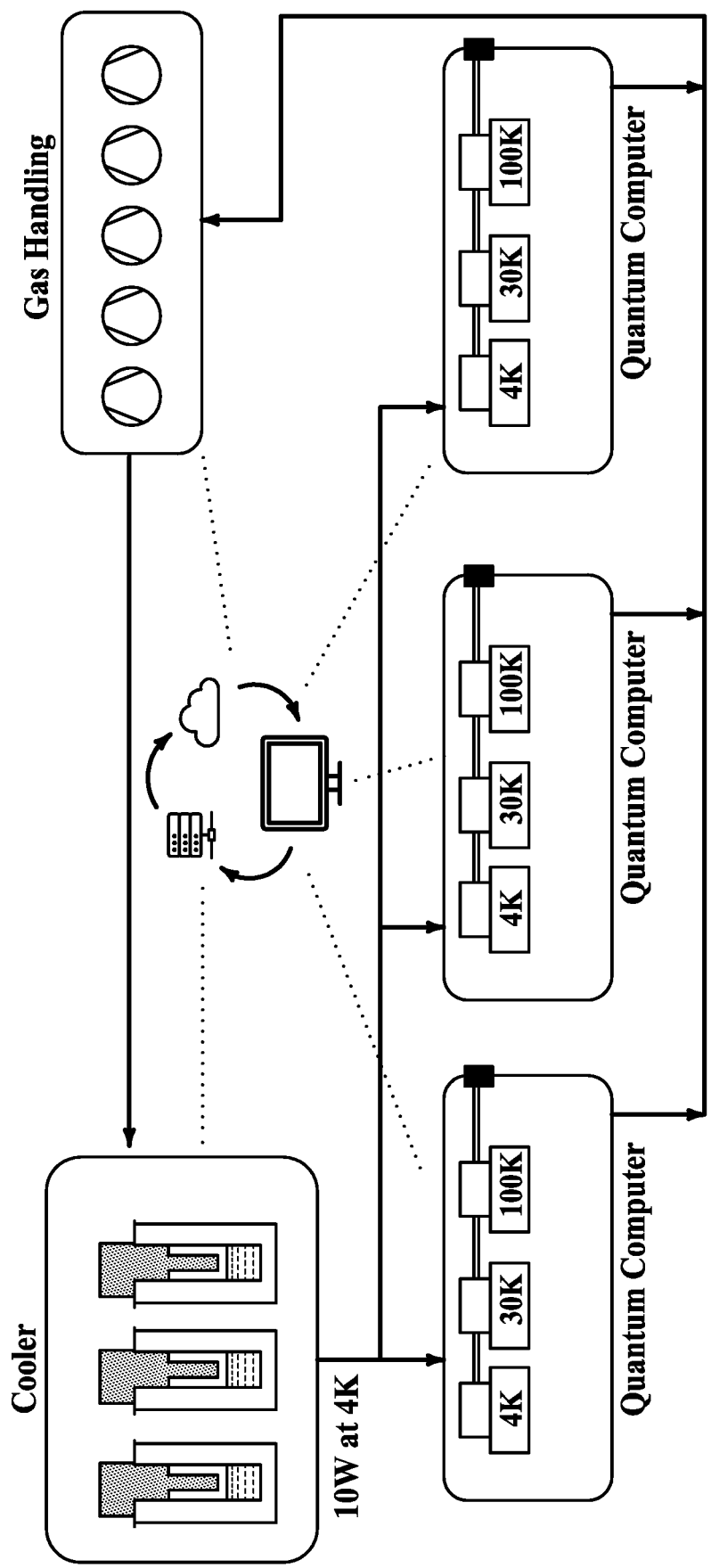
FIG. 4B is a box diagram of another processing circuitry cooling system according to another embodiment of the disclosure.

FIG. 4B depicts a block diagram of another system scaled to cool multiple quantum processing circuitry configurations. Accordingly, where >10 W of cooling power at 4K, for example, is required to cryogenically cool quantum processing circuitry with thousands or even millions of qubits, embodiments of the present systems and/or methods can provide multiple (e.g., three) cryocoolers used to create and store liquid helium. This liquid helium can be delivered through cryogenic fluid conduits to three quantum processing circuitry configurations, shown here in a parallel orientation. Heat exchangers can be provided within each vacuum chamber housing the quantum processing circuitry with a thermal mounting flange to mount the quantum processing circuitry (electronics, processing chips, and/or I/O). As shown, each quantum processing circuitry configuration can have independent vacuum housing, however, they could be combined in a single vacuum housing in other embodiments. A gas handling system is provided to control the flow of liquid helium out of each quantum computer and circulate it back to the cooler. As shown, the gas handling system includes many pumps required to control the pressure and flow rate of the liquid helium through each chamber. The cooler and gas handling systems can be independent modules located far from the quantum processing circuitry in an effort to minimize coupling of vibrations or electrical noise into the quantum computer environment. FIG. 4B shows a central processing circuitry used to control the cooler, quantum processing circuitry, and/or gas handling systems. This processing circuitry could include a user interface, computer, and access to data storage necessary to monitor and control the system.

Figure 5:
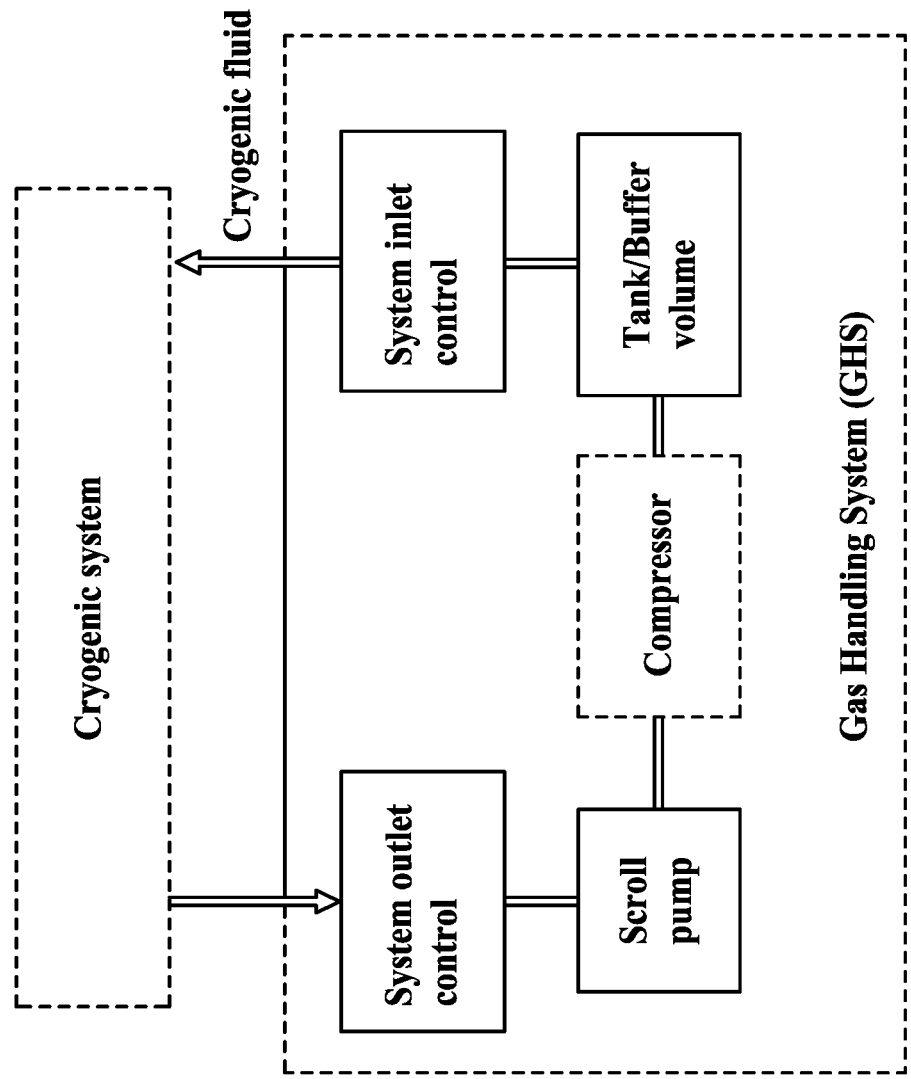
FIG. 5 is a box diagram of a gas handling system according to an embodiment of the disclosure.

FIG. 5 shows a gas-handling system (GHS), which can be configured to operate as part of a cooling system of the present disclosure and control the flow of cryogenic fluid into and out of the chamber housing the quantum computer component. Typical fluids include those that liquefy at cryogenic temperatures, for example helium and nitrogen. The gas handling system can contain a vacuum pump, such as a scroll or roots blower pump, to reduce the vapor pressure and thereby reduce the temperature of the cryogenic fluid via evaporative liquid. It may also include a compressor that compresses gas from the vacuum pump exhaust to some increased pressure (typically >1 atm). A tank or buffer volume can be provided to be included in the GHS that is sufficiently large to store all the gas required by the system to reach and maintain cryogenic temperatures. Also included in the GHS are control components, including for example pressure transducers, mass flow meters, variable flow valves, and control HW & SW to control the flow into and out of the GHS; each of which can be controlled by processing circuitry 16 of the system.

Figure 6:
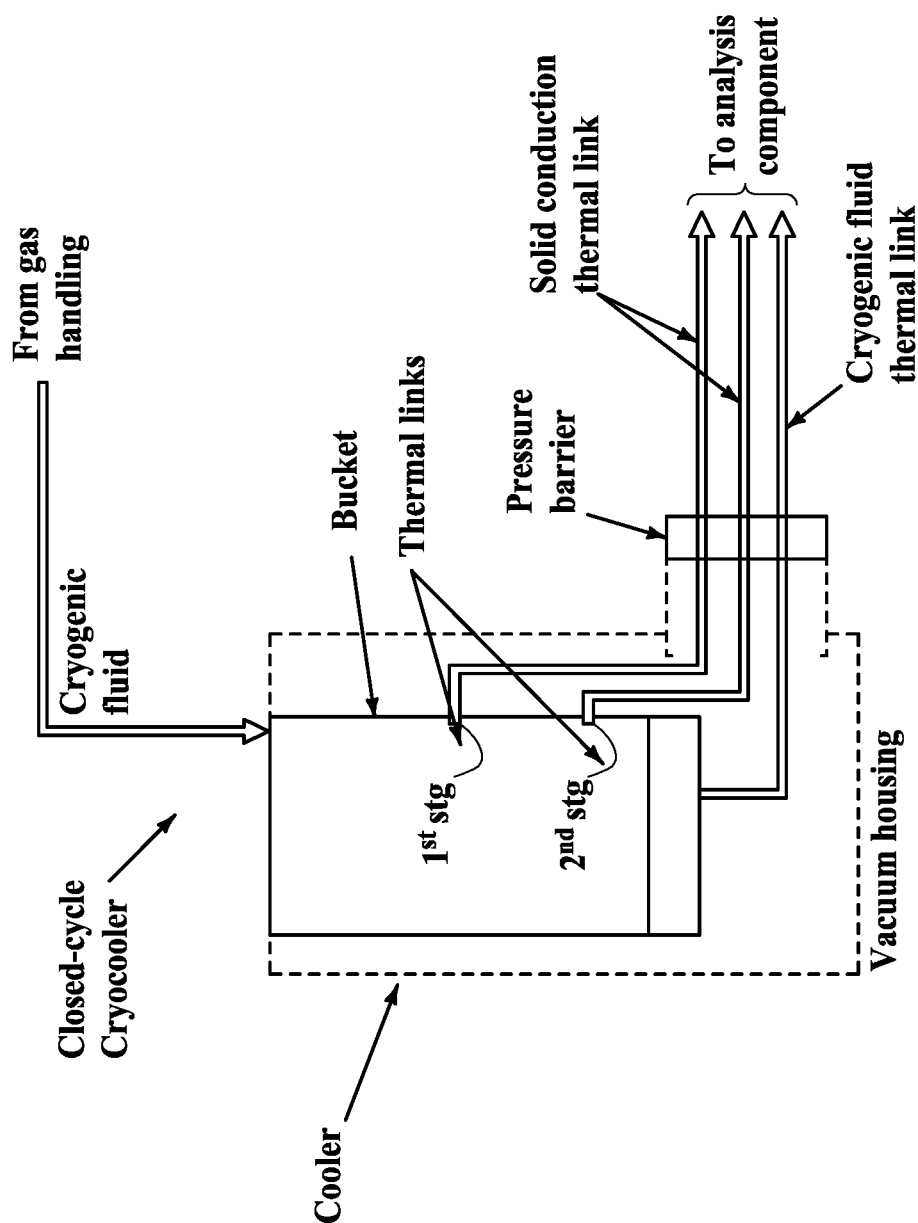
FIG. 6 is a box diagram of another processing circuitry cooling system according to another embodiment of the disclosure.

The systems can include thermal links that can provide thermal communication between a cooler and quantum computer component. FIG. 6 depicts a cooler system comprising a cryocooler oriented in a bucket that is surrounded by a vacuum housing. Warm cryogenic fluid from the gas handling system is fed into the bucket. The cryocooler cools the fluid and ultimately condenses the gas into a liquid that is stored at the bottom of the bucket. Cryogenic fluid can be provided from this source and delivered to quantum processing circuitry through a cryogenic fluid conduit to cool the quantum processing circuitry via a cryogenic fluid thermal link. The bucket can include flanges that are in thermal communication with the $1^{st}$ and $2^{nd}$ stage of the cryocooler via thermal links. The flanges provide locations for mounting solid conduction thermal links to the quantum processing circuitry to be in thermal communication with the cooler via solid conduction thermal links (see for example, US Patent Application Publication No. US 2020/0109764 to Motley et al, the entirety of which is incorporated by reference herein).

FIG. 6 also shows a pressure barrier which separates the vacuum housing of the quantum processing circuitry from the vacuum housing of the cooler. The pressure barrier represents a physical barrier separating two spaces that enables thermal communication between components located in each space (see for example, US Patent Application Publication No. US 2019/0170620 to Reijnders et al., the entirety of which is incorporated by reference herein). Thermal communication across the pressure barrier can comprise a cryogenic fluid thermal link and/or a solid conduction thermal link.

Figure 7:
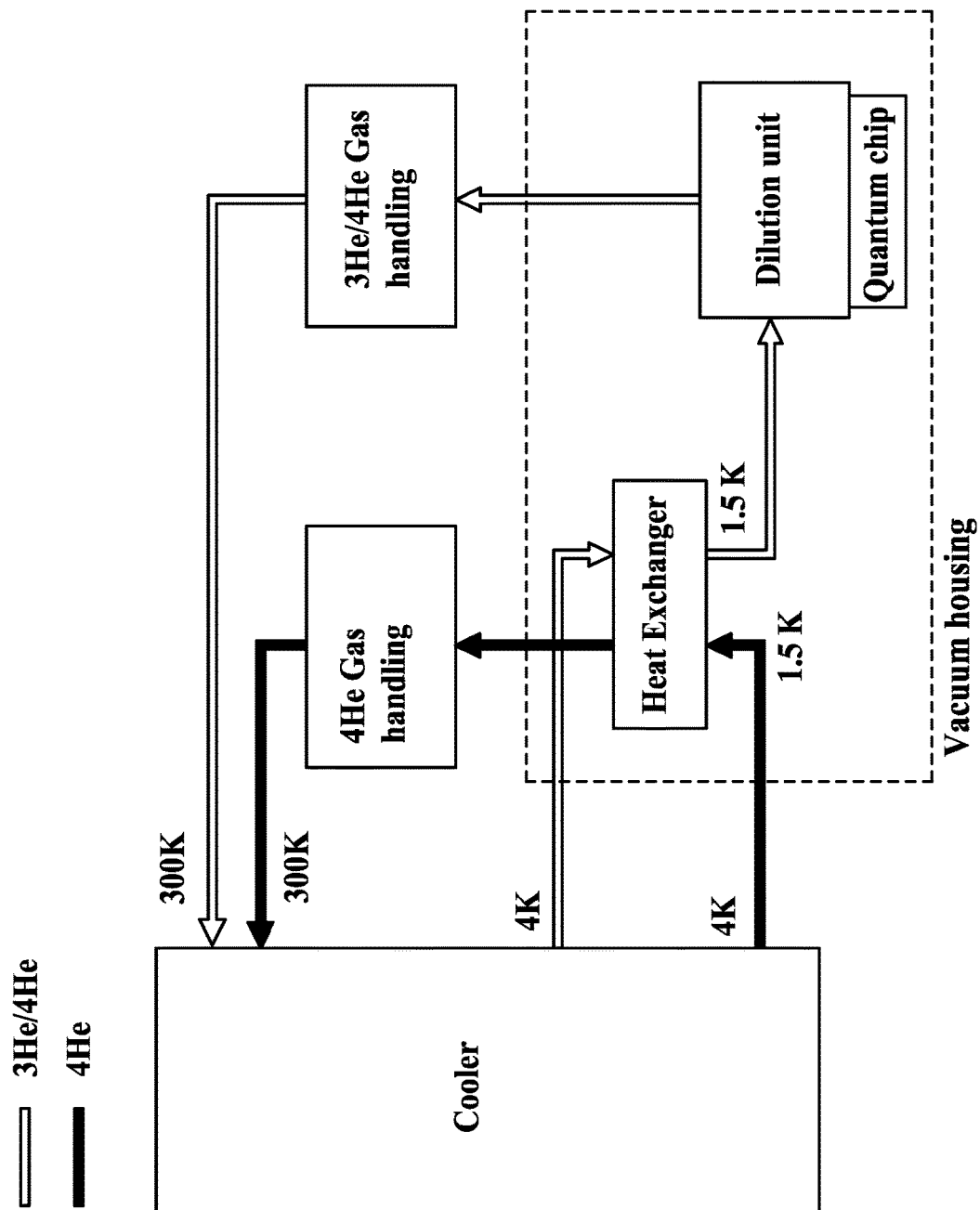
FIG. 7 is a box diagram of another processing circuitry cooling system according to another embodiment of the disclosure.

FIG. 7 shows a specific example of the proposed cryogenic system architecture for cooling a dilution unit in quantum processing circuitry that can be a superconducting qubit based quantum computer systems. A dilution unit is a device that utilizes dilution of two isotopes of helium (3He and 4He) to reach temperatures <10 mK. As shown in FIG. 7, the proposed architecture utilizes two separate cryogenic fluid loops. The first contains only 4He. The second contains a 3He/4He mixture. The Gas Handling system contains components for controlling the pressure and flow rate of each cryogenic fluid loop. A cooler is used to cool each cryogenic fluid loop, creating a source of 4K 4He and a separate source of 4K 3He/4He mixture.

Referring next to FIG. 8 a block diagram cooling system 80 can include a cooler configured to condense a cryofluid in a bucket 82. The entirety of the cooler can be a separate vacuum housing. As described, this cooler can have flanges 84 and 86. Each of these flanges can be operably coupled for cooling to heat exchanger 89 which is in operable fluid communication with spent cryofluid (higher temperature cryofluid). Accordingly, each of the flanges can be used to provide a specific temperature to the heat exchanger and bring cryofluid passing that coupled portion to a predetermined temperature. Accordingly, using valves, cryofluid may be taken from the heat exchanger proximate the coupled portion to provide cryofluid of that specific temperature. For example, cryofluid removed at 92 will have the temperature of the flange 84 via link 91; cryofluid removed at 94 will have the temperature of flange 86 via link 93; and cryofluid removed at 96 will have the temperature of liquid cryofluid 88.

Accordingly, the systems can include a plurality of thermal couplings between cooler 80 and a device to be cooled, which may or may not include quantum processing circuitry with at least one of the thermal couplings being a first conduit system configured to convey cryofluid between the cooler and the device. The first conduit system can include a first heat exchanger within the cooler and configured to receive the cryofluid from the device, cool the cryofluid using the heat exchanger, and provide cooler cryofluid to the device.

FIG. 9 shows another example cooler configuration. Here, a cryocooler can be placed around a bucket whereby the bucket is sealed as to contain an input gas. 300K 4He is fed into the bucket space, provided from a 4He gas handling system. The cryocooler condenses the 4He which collects in the bottom of the bucket at 4K. The bucket also contains a sealed 3He/4He conduit, for example a copper tube, that has an input and output end at the top and bottom of the bucket respectively. The 3He/4He conduit is sealed from the 4He in the bucket such that the 3He/4He mixture does not mix with the 4He fluid inside the bucket. 300K 3He/4He gas is fed into the 3He/4He conduit, from the 3He/4He gas handling system. Because the 3He/4He conduit is in the bucket, surrounded by cooling 4He gas, the 3He/4He mixture inside the 3He/4He conduit cools and condenses. In other embodiments, the 3He/4He conduit can be wrapped around the cryocooler within the bucket or thermally lagged to the cryocooler as to increase cooling power to the 3He/4He conduit.

In FIG. 9 the 4He Gas handling can contain a vacuum pump, which reduces the vapor pressure in the 4K 4He loop, resulting in evaporative cooling and a drop in temperature to 1.5K. The 1.5K He4 cryogenic fluid is used to cool the 4K 3He/4He cryogenic fluid to 1.5K via a heat exchanger. The 1.5K 4He loop leaves the heat exchanger and ultimately goes through the 4He gas handling system, potentially passing through other heat exchangers to cool other components. Also leaving the heat exchanger, is the 1.5K 3He/4He cryogenic fluid that is fed as input to the dilution unit. In the dilution unit, the 3He/4He mixture goes through a still, multiple heat exchangers, and a mixing chamber. Temperature flanges are provided on the dilution unit to serve as locations for thermally lagging components. Typically, a 1K, 100 mK, and 10 mK flange are provided. The qubit processor or chip (quantum processing circuitry) can be mounted on the dilution unit mixing chamber, where the lowest temperature (<10 mK) is achieved. The 3He/4He fluid leaves the dilution unit and goes to the 3He/4He gas handling system. Each gas handling system (4He and 3He/4He recirculates the cryogenic fluids back to the cooler for closed-loop operation.

In other embodiments, a heat exchanger can be used to control the temperature of any quantum processing circuitry. For example, the quantum chip may be in thermal communication while an electronic amplifier is in thermal communication with another. The temperature of each heat exchanger can be precisely controlled by regulating the flow of cryogenic fluid to each heat exchanger. This enables an optimization of available cooling power and the ability to operate components at whatever temperature is required.

In other embodiments, additional cryogenic fluid loops can exist. In other embodiments, other heat exchangers may exist. One cryogenic fluid path can be fed per heat exchanger and/or multiple heat exchangers can be installed on a single cryogenic fluid path.

In other embodiments, multiple vacuum housings may exist. Quantum processing circuitry configurations can exist in one vacuum space and/or be located in other vacuum spaces separated by pressure barriers. In other embodiments, the cooler may contain one or many cryocoolers.

In another embodiment, multiple coolers can be utilized as cooling sources. For example, a cooler can be used to create a source of 4He and another cooler can be used to supply a source of 3He/4He. Each cooler can provide cooling to one or more quantum processing circuitry configurations in one or more vacuum housings.

In accordance with the systems provided herein, methods for cooling processing circuitry are provided that can include providing cooling to processing circuitry from a cooling source in a chamber having an independent pressure from the pressure about the processing circuitry.

The cooling can be provided with one or both of cryofluid and/or conductive links, and/or to one or both input/output and/or cryo electronics. The cooling can be provided with at least two types of cryofluid to cool the processing circuitry, for example.

In compliance with the statute, embodiments of the invention have been described in language more or less specific as to structural and methodical features. It is to be understood, however, that the entire invention is not limited to the specific features and/or embodiments shown and/or described, since the disclosed embodiments comprise forms of putting the invention into effect. The invention is, therefore, claimed in any of its forms or modifications within the proper scope of the appended claims appropriately interpreted in accordance with the doctrine of equivalents.

The invention claimed is:

1. A quantum processing circuitry cooling system, the system comprising: a first chamber maintained at a first pressure; a second chamber maintained at a second pressure, wherein the first and second pressures are independent from one another; a cooler within the first chamber and operable to act as a cooling source for the cooling system; and quantum processing circuitry within the second chamber, the processing circuitry being thermally coupled to the cooler; and an input/output operably coupled to the quantum processing circuitry and being separately thermally coupled to the cooler.

2. The quantum processing circuitry cooling system of claim 1 further comprising cryo electronics operably coupled to the quantum processing circuitry and being separately thermally coupled to the cooler.

3. The quantum processing circuitry cooling system of claim 1 wherein the thermal coupling between the cooler and quantum processing circuitry comprises a cryofluid.

4. The quantum processing circuitry cooling system of claim 3 further comprising a heat exchanger within the second chamber and configured to receive the cryofluid.

5. The quantum processing circuitry cooling system of claim 4 wherein the heat exchanger is thermally linked to the quantum processing circuitry.

6. The quantum processing circuitry cooling system of claim 5 further comprising a gas handling system operably engaged between the heat exchanger and the cooler.

7. The quantum processing circuitry cooling system of claim 6 wherein the gas handling system can include one or more of a pump, compressor, and/or a tank.

8. The quantum processing circuitry cooling system of claim 1 wherein the cooler is configured to provide cryofluid, and further comprising at least one solid conduction thermal link and at least one cryofluid conduit, wherein both the link and conduit extend to the second chamber.

9. The quantum processing circuitry cooling system of claim 1 wherein the cooler is configured to provide at least two forms of cryofluid to the second chamber.

10. A method for cooling quantum processing circuitry, the method comprising providing cooling to quantum processing circuitry from a cooling source in a chamber having an independent pressure from the pressure about the quantum processing circuitry; and providing cooling to one or both input/output and/or cryo electronics.

11. The method of claim 10 further comprising providing the cooling with one or both of cryofluid and/or conductive links.

12. The method of claim 10 further comprising providing at least two types of cryofluid to cool the quantum processing circuitry.

13. The method of claim 10 further comprising providing the cooling with one or both of cryofluid and/or conductive links, wherein at least one of the links provides warmer temperatures than the cryofluid.

14. The method of claim 13 further comprising generating one liquid cryofluid in the cooler.

15. The method of claim 14 further comprising cooling another liquid cryofluid in the cooler.

\* \* \* \* \*